(12) United States Patent
Huang et al.

(10) Patent No.: US 9,099,400 B2
(45) Date of Patent: Aug. 4, 2015

(54) SEMICONDUCTOR DEVICE MANUFACTURING METHODS

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW); Cheng-Hsiung Tsai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

(21) Appl. No.: 14/042,253

(22) Filed: Sep. 30, 2013

(65) Prior Publication Data
US 2015/0093899 A1 Apr. 2, 2015

(51) Int. Cl.
*H01L 21/306* (2006.01)
*H01L 21/308* (2006.01)

(52) U.S. Cl.
CPC ...... *H01L 21/30625* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 2008/0090418 A1* | 4/2008 | Jeon et al. | 438/689 |
| 2009/0263749 A1* | 10/2009 | Sim et al. | 430/319 |
| 2010/0170871 A1* | 7/2010 | Sone et al. | 216/47 |
| 2011/0227231 A1* | 9/2011 | Lee et al. | 257/773 |
| 2013/0029436 A1* | 1/2013 | Fujita | 438/8 |
| 2014/0220767 A1* | 8/2014 | Hu | 438/585 |
| 2014/0264758 A1* | 9/2014 | Huisinga et al. | 257/618 |

* cited by examiner

*Primary Examiner* — Allan Olsen
(74) *Attorney, Agent, or Firm* — Slater & Matsil, L.L.P.

(57) ABSTRACT

Semiconductor device manufacturing methods are disclosed. In some embodiments, a method of manufacturing a semiconductor device includes forming a first pattern in a hard mask using a first lithography process, and forming a second pattern in the hard mask using a second lithography process. A protective layer is formed over the hard mask. Portions of the hard mask and portions of the protective layer are altered using a self-aligned double patterning (SADP) method.

20 Claims, 12 Drawing Sheets

SEMICONDUCTOR DEVICE MANUFACTURING METHODS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As feature sizes are decreased, patterning techniques become more and more challenging.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance. Copper is now often used as a conductive material for interconnects in some applications. Low dielectric constant (k) materials that have dielectric constants less than that of silicon dioxide have begun to be implemented in some designs as insulating materials between interconnects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to patterning methods for semiconductor devices. Novel self-aligned double patterning (SADP) methods will be described herein that include a protective layer formed over a hard mask after initial patterning steps.

Figure 1:
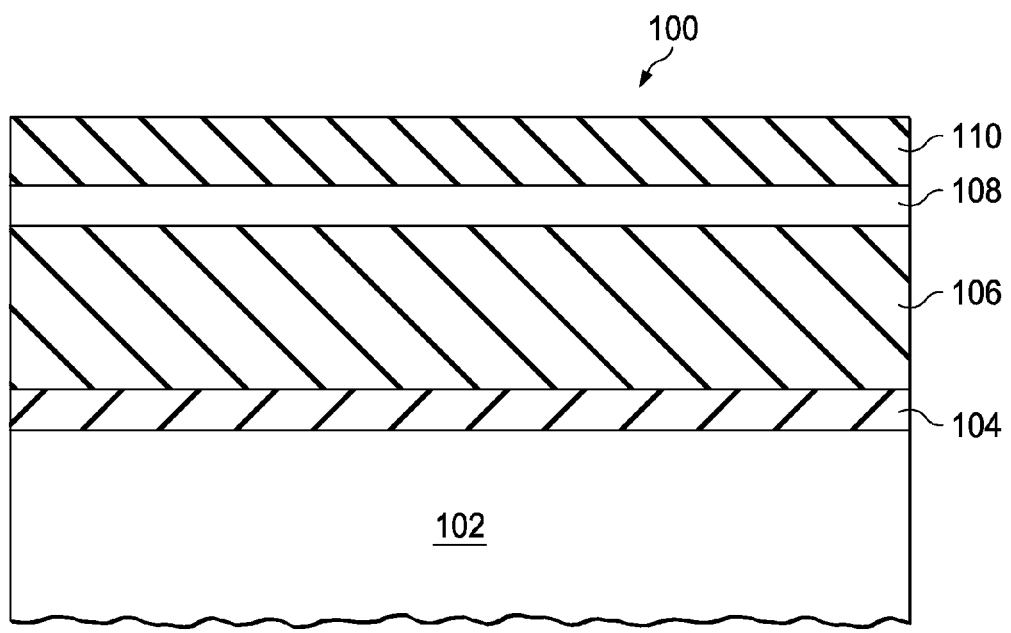
FIGS. 1 through 19 show cross-sectional views of a method of manufacturing a semiconductor device at various stages in accordance with some embodiments of the present disclosure using a novel self-aligned multiple patterning technique.

FIGS. 1 through 19 show cross-sectional views of a method of manufacturing a semiconductor device 100 at various stages in accordance with some embodiments of the present disclosure using novel self-aligned multiple patterning techniques. Referring first to FIG. 1, there is shown a cross-sectional view of a semiconductor device 100 in accordance with some embodiments of the present disclosure. To manufacture the semiconductor device 100, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

In some embodiments, an etch stop layer (ESL) 104 is formed or deposited over the workpiece 102. In other embodiments, an ESL 104 is not included. The ESL 104 comprises a material with an etch selectivity to a subsequently deposited material layer, such as material layer 106. The ESL 104 etches at a slower rate than the material layer 106 etches during an etch process for the insulating material layer 106, for example. The ESL 104 may comprise SiN, SiON, nitride-doped carbide, or oxide-doped carbide, as examples. The ESL 104 comprises a thickness of about 100 Angstroms or less, for example. In some embodiments, the ESL 104 comprises a thickness of about 50 Angstroms. Alternatively, the ESL 104 may comprise other materials and dimensions.

A material layer 106 is deposited or formed over the ESL 104 or over the workpiece 102, in embodiments wherein an ESL 104 is not included. The material layer 106 comprises an insulating material layer in some embodiments. The insulating material layer 106 will be patterned and filled with a conductive material using a damascene process in some embodiments, for example. Alternatively, the material layer 106 may comprise a conductive material, a semiconductive material, or multiple layers of insulating materials, conductive materials, and/or semiconductor materials, in other embodiments. The material layer 106 comprises a material layer to be patterned.

In embodiments wherein the material layer 106 comprises an insulating material layer 106, the insulating material layer 106 may comprise silicon dioxide or SiOC, as examples. The insulating material layer 106 comprises a low dielectric constant (k) material in some embodiments that has a dielectric constant less than a dielectric constant of silicon dioxide, for example. The insulating material layer 106 comprises a thickness of about 1,500 Angstroms or less in some embodiments, for example. In some embodiments, the insulating material layer 106 comprises a thickness of about 1,100 Angstroms. The insulating material layer 106 may be deposited using a spin-on method, chemical vapor deposition (CVD), or plasma enhanced CVD (PECVD), as examples. Alternatively, the insulating material layer 106 may comprise other materials and dimensions and may be formed using other methods.

An anti-reflective coating (ARC) 108 is formed or deposited over the material layer 106. The ARC 108 comprises a nitride-free ARC 108 in some embodiments. Alternatively, the ARC 108 may comprise other materials. The ARC 108 comprises a thickness of about 300 Angstroms in some embodiments. Alternatively, the ARC 108 may comprise other dimensions. In some embodiments, an ARC 108 is not included.

A hard mask 110 is formed over the ARC 108, or over the material layer 106, in embodiments wherein the ARC 108 is not included. The hard mask 110 comprises TiN, TiO, amorphous Si, SiN, or combinations or multiple layers thereof in some embodiments, for example. The hard mask 110 comprises a thickness of about 500 Angstroms or less, for example. In some embodiments, the hard mask 110 comprises a thickness of about 380 Angstroms. The hard mask 110 may be deposited using physical vapor deposition (PVD), atomic layer deposition (ALD), or CVD, as examples. Alternatively, the hard mask 110 may comprise other materials and dimensions and may be formed using other methods.

Figure 2:
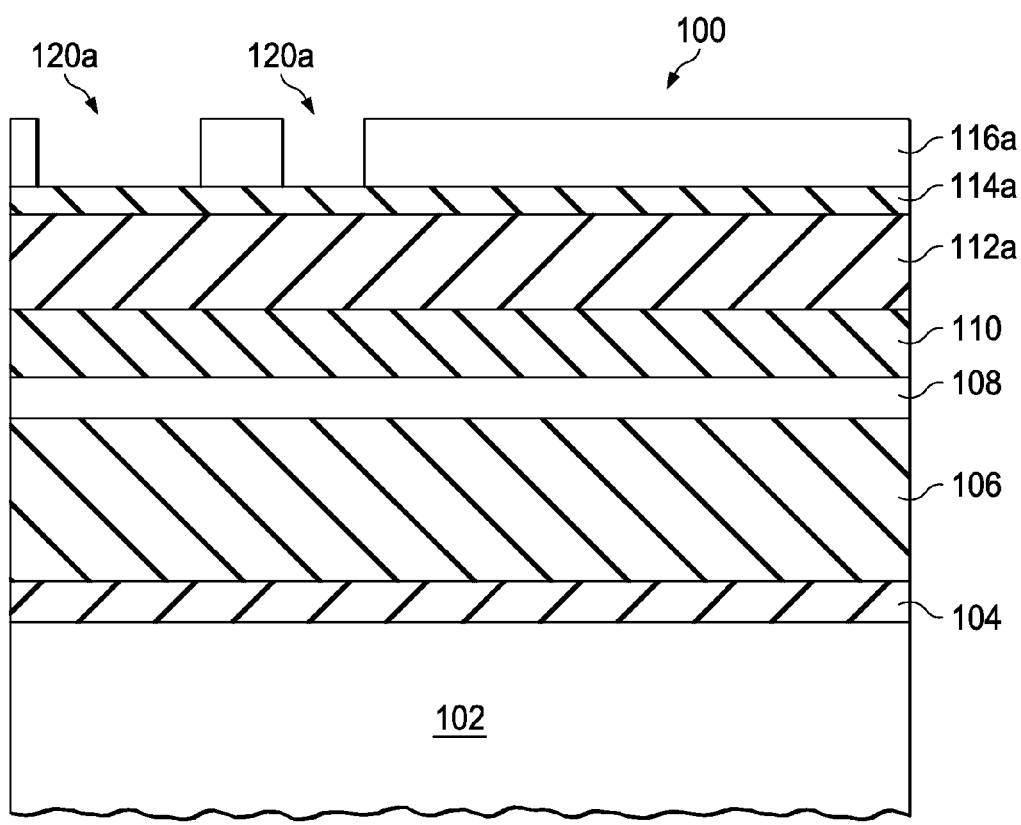
Figure 3:
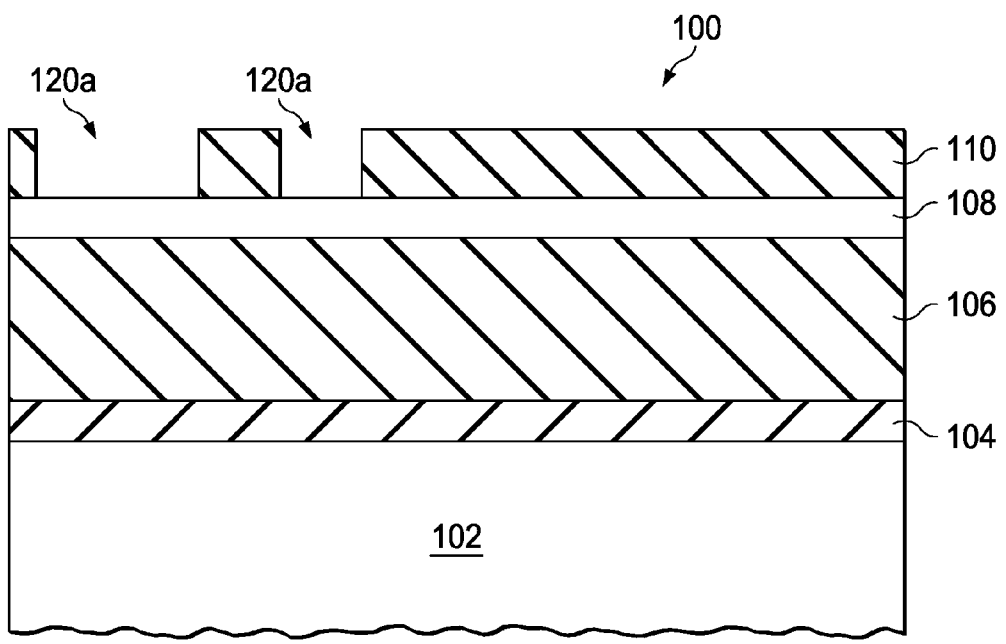
Figure 4:
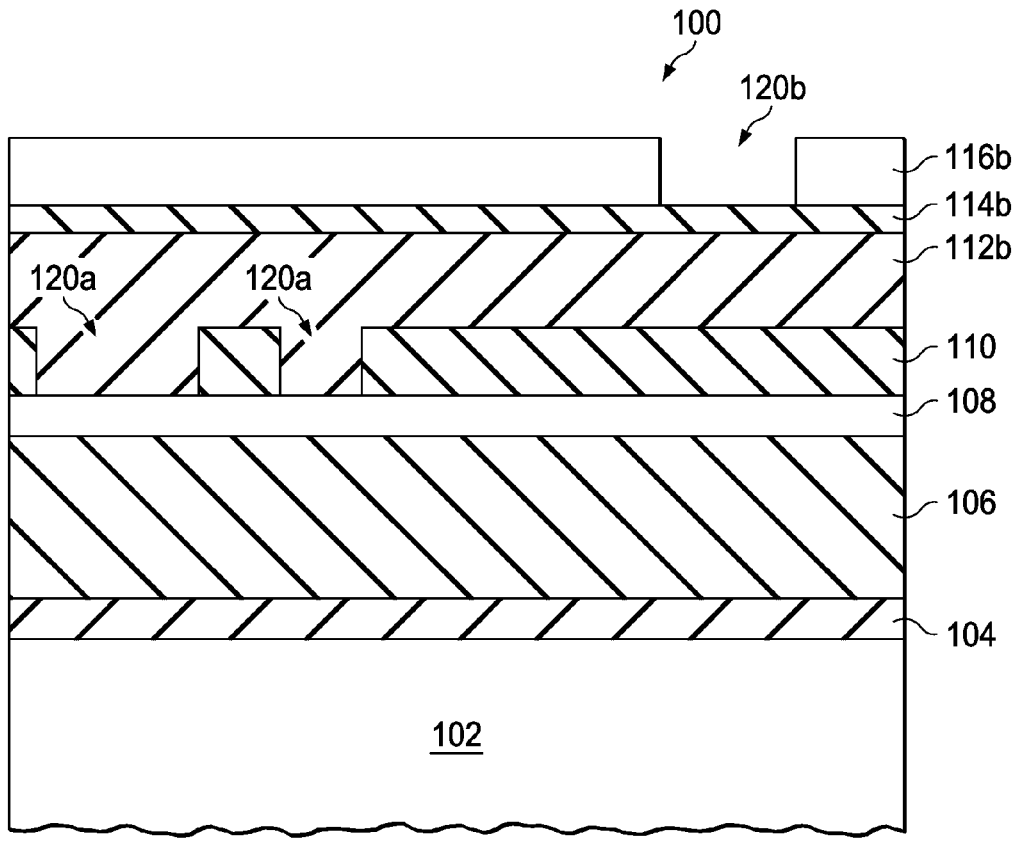
Figure 5:
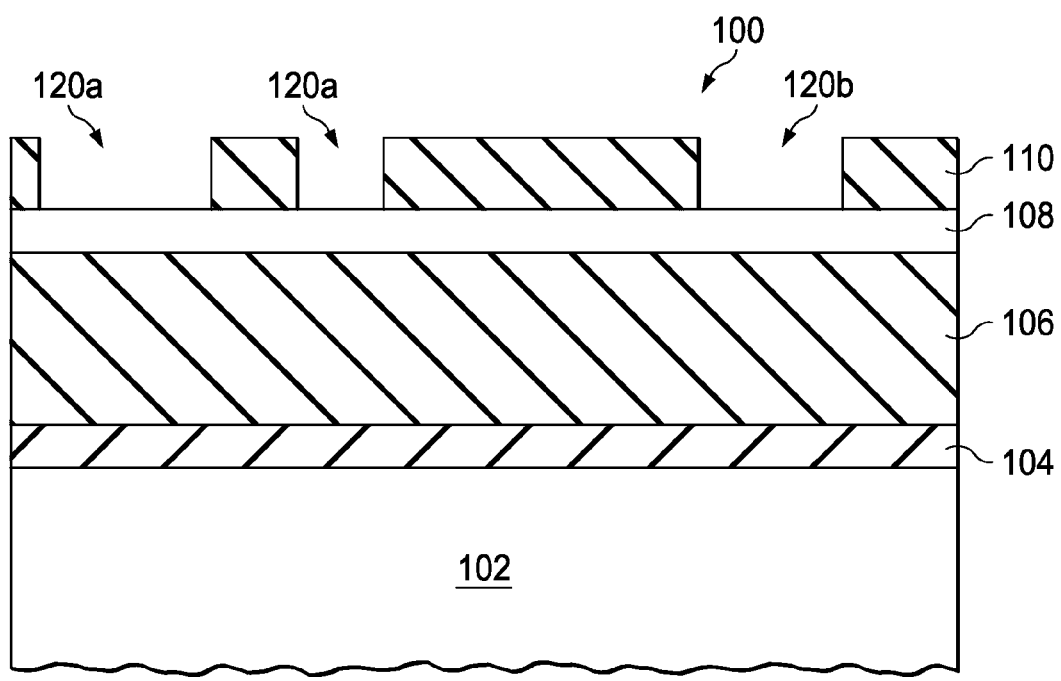

In accordance with some embodiments, a first pattern 120a is formed in the hard mask 110 using a first lithography process, as shown in FIGS. 2 and 3, and a second pattern 120b is formed in the hard mask 110 using a second lithography process, as shown in FIGS. 4 and 5, to be described further herein.

To form the first pattern 120a, a bottom transfer layer 112a is formed over the hard mask 110, as shown in FIG. 2. The bottom transfer layer 112a comprises about 50 nm to about 2,000 nm of a material including C, H, and O in some embodiments, as examples. Alternatively, the bottom transfer layer 112a may comprise other dimensions and materials. The bottom transfer layer 112a comprises a sacrificial layer that is used to pattern a first pattern 120a (not shown in FIG. 2; see FIG. 3) in the hard mask 110.

A middle transfer layer 114a is formed over the bottom transfer layer 112a, also shown in FIG. 2. The middle transfer layer 114a comprises about 10 nm to about 50 nm of silicon oxide in some embodiments, as examples. Alternatively, the middle transfer layer 114a may comprise other dimensions and materials. The middle transfer layer 114a also comprises a sacrificial layer that is used to pattern a first pattern 120a in the hard mask 110.

A photoresist 116a is formed over the middle transfer layer 114a, as shown in FIG. 2. The photoresist 116a is patterned using a first lithography process, by exposing the photoresist 116a to light or energy reflected from or transmitted through a first lithography mask having a desired pattern thereon. The photoresist 116a is then developed, and exposed portions (or unexposed portions, depending on whether the photoresist 116a comprises a positive or negative photoresist) of the photoresist 116a are etched away, leaving the first pattern 120a in the photoresist 116a, as shown in FIG. 2. The first pattern 120a comprises a plurality of openings or patterns in the photoresist 116a.

An etch process is performed on the semiconductor device 100 to transfer the first pattern 120a from the photoresist 116a to the middle transfer layer 114a and the bottom transfer layer 112a. The middle transfer layer 114a and bottom transfer layer 112a, or the photoresist 116a, middle transfer layer 114a, and bottom transfer layer 112a are then used as an etch mask during an etch process for the hard mask 110, which transfers the first pattern 120a to the hard mask 110, as shown in FIG. 3. The middle transfer layer 114a and bottom transfer layer 112a are then removed. The photoresist 116a may be removed during the patterning of the middle transfer layer 114a and/or bottom transfer layer 112a in some embodiments, for example.

Figure 19:
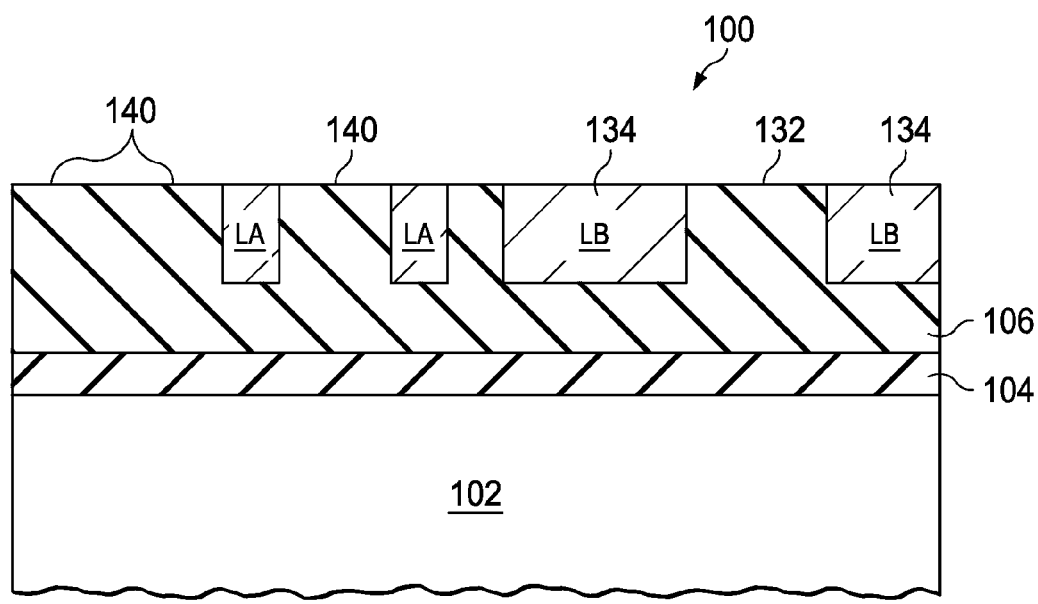
Figure 20:
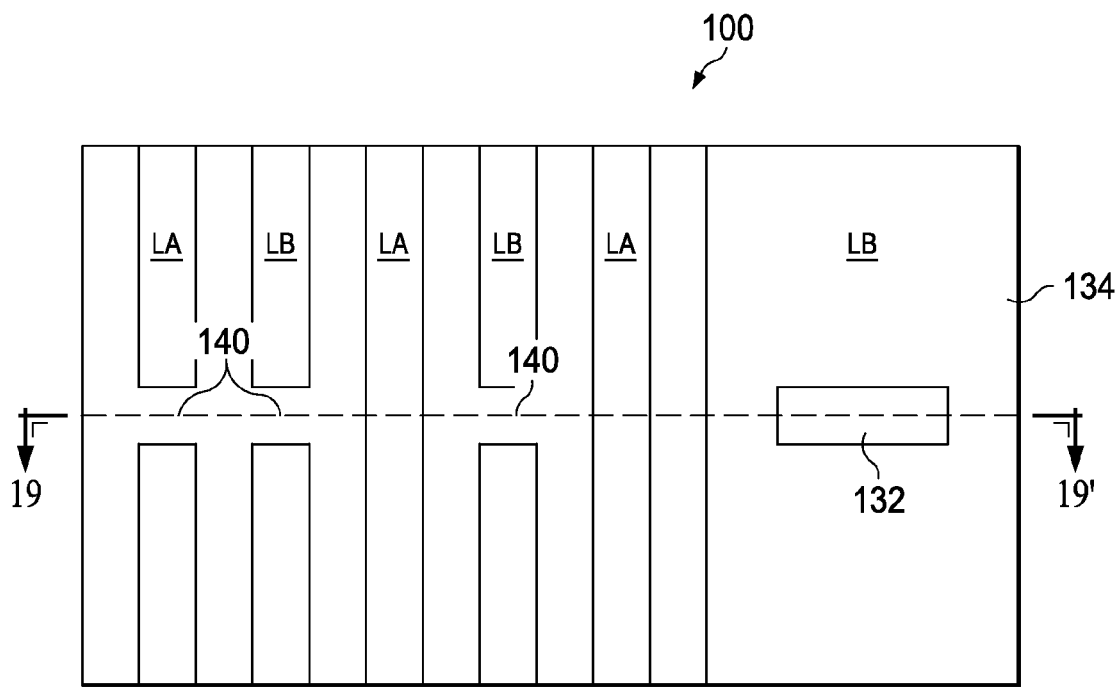
FIG. 20 is a top view of the semiconductor device shown in FIG. 19, illustrating patterns of conductive lines in accordance with some embodiments.

The first pattern 120a comprises a plurality of patterns for regions 140 where a conductive line LA or LB is cut (see regions 140 in FIGS. 19 and 20). The plurality of patterns of the first pattern 120a is also referred to herein collectively, e.g., in some of the claims, as a first pattern.

To form the second pattern 120b, a bottom transfer layer 112b is formed over the hard mask 110, as shown in FIG. 4. The bottom transfer layer 112b comprises similar dimensions and materials as described for bottom transfer layer 112a in some embodiments, as examples. Alternatively, the bottom transfer layer 112b may comprise other dimensions and materials. The bottom transfer layer 112b comprises a sacrificial layer that is used to pattern the second patterns 120b (not shown in FIG. 4; see FIG. 5) in the hard mask 110.

A middle transfer layer 114b is formed over the bottom transfer layer 112b, also shown in FIG. 4. The middle transfer layer 114b comprises similar dimensions and materials as described for middle transfer layer 114a in some embodiments, as examples. Alternatively, the middle transfer layer 114b may comprise other dimensions and materials. The middle transfer layer 114b also comprises a sacrificial layer that is used to pattern the second patterns 120b in the hard mask 110.

A photoresist 116b is formed over the middle transfer layer 114b, as shown in FIG. 4. The photoresist 116b is patterned using a second lithography process and a second lithography mask, as described for the first lithography process for the photoresist 116a, forming the second pattern 120b in the photoresist 116b, as shown in FIG. 4. The second pattern 120b comprises a plurality of openings or patterns in the photoresist 116b. At least some of the plurality of patterns of the second pattern 120b are different than the plurality of patterns of the first pattern 120a in some embodiments. For example, the plurality of patterns of the second pattern 120b are in a different location than the plurality of patterns of the first pattern 120a in some embodiments.

An etch process is performed on the semiconductor device 100 to transfer the second pattern 120b from the photoresist 116b to the middle transfer layer 114b and the bottom transfer layer 112b. The middle transfer layer 114b and bottom transfer layer 112b, or the photoresist 116b, middle transfer layer 114b, and bottom transfer layer 112b are then used as an etch mask during an etch process for the hard mask 110, which transfers the second pattern 120b to the hard mask 110, as shown in FIG. 5. The middle transfer layer 114b and bottom transfer layer 112b are then removed. The photoresist 116b may be removed during the patterning of the middle transfer layer 114b and/or bottom transfer layer 112b in some embodiments, for example.

The second pattern 120b comprises at least one pattern for an island or opening 132 in a capacitive plate 134 (see conductive line LB comprising a capacitive plate 134 including an opening 132 in FIGS. 19 and 20). The plurality of patterns of the second pattern 120b are also referred to herein collectively, e.g., in some of the claims, as a second pattern.

In some embodiments, at least one of the second patterns 120b is placed between two of the first patterns 120a, or at least one of the first patterns 120a is placed between two of the second patterns 120b (not shown). In other words, each second pattern 120b is alternated with a first pattern 120a in some embodiments, so that every other pattern is a first pattern 120a and a second pattern 120b. In some embodiments, the critical dimension (CD) or smallest feature size of the first pattern 120a and the second pattern 120b is very small and the pattern density is very high, which requires the patterning of the first pattern 120a and the second pattern 120b in two separate lithography processes, as illustrated in FIGS. 2 through 5. The overall pattern desired is separated into two lithography masks, for example, because of the high density.

In some embodiments, the first lithography process or the second lithography process comprises a "cut island open" step, e.g., to form an opening 132 in a capacitive plate 134 and/or a "cut slot" step, e.g., to form conductive lines LA and LB, respectively, as shown in FIG. 20, for example.

Figure 6:
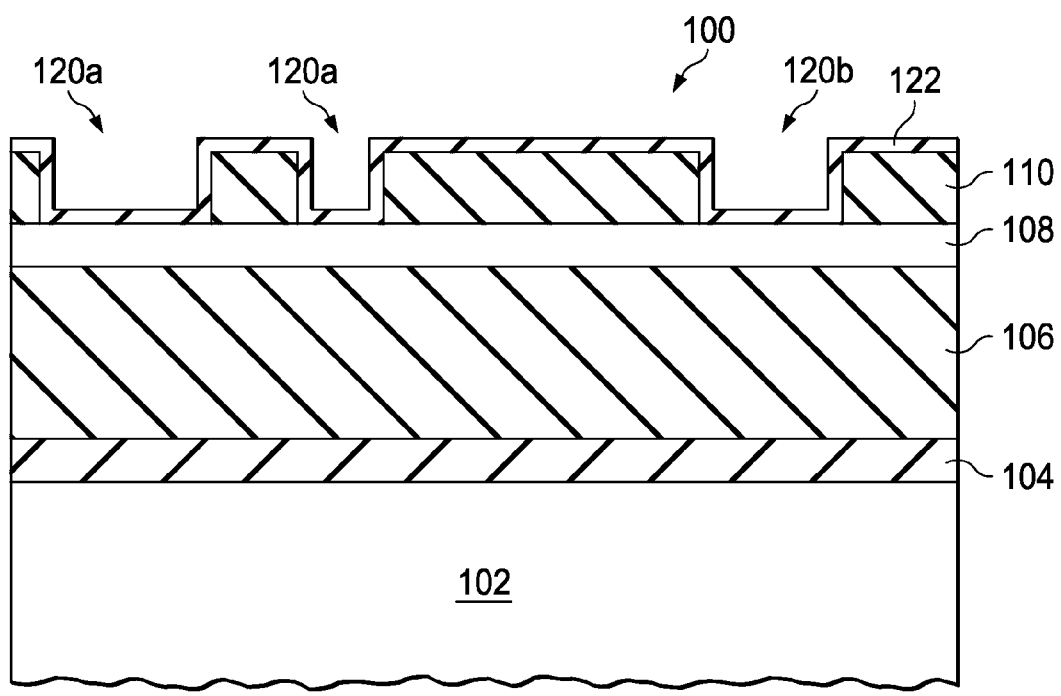

After the second lithography process to form the second pattern 120b, the hard mask 110 includes the first pattern 120a and the second pattern 120b, as shown in FIG. 5. A protective layer 122 is then applied over the patterned hard mask 110 in some embodiments, as shown in FIG. 6. The novel protective layer 122 is applied and included in the manufacturing process flow to improve etch stop capability and decrease loss of material of the hard mask 110 during various etch processes used to manufacture the semiconductor device 100, to be described further herein. The protective layer 122 is deposited after a "cut island open" step or after a "cut slot" step in some embodiments, as examples. Alternatively, the protective layer 122 may be formed at other points in the manufacturing and patterning process of the semiconductor device 100.

The protective layer 122 is formed over the top surfaces and sidewalls of the hard mask 110 and over the exposed top surfaces of the ARC 108 or material layer 106, in embodiments wherein the ARC 108 is not included. The protective layer 122 comprises AlON, TiO, TiN, other materials, or a combination or multiple layers thereof, for example. The protective layer 122 comprises a thickness of about 5 Angstroms to about 20 Angstroms, for example. The protective layer 122 is formed using an ALD process, for example. Alternatively, the protective layer 122 may comprise other materials and dimensions and may be formed using other methods. In some embodiments, the etch selectivity of the hard mask 110 material to the protective layer 122 material comprises about 3 to 5, for example. Alternatively, the hard mask 110 and protective layer 122 may comprise other relative etch selectivities.

In some embodiments, the protective layer 122 comprises AlON deposited by ALD at a temperature of about 100 degrees C. to about 400 degrees C., at a pressure of about 1 Torr to about 30 Torr, at a frequency of about 13.56 MHz, at a power of about 50 Watts (W) to about 500 W, and in the presence of or in an ambient of $N_2$, $H_2$, and/or $NH_3$, as an example. In other embodiments, the protective layer 122 comprises TiO deposited by ALD at a temperature of about 80 degrees C. to about 300 degrees C., at a pressure of about 1 Torr to about 20 Torr, at a frequency of about 13.56 MHz, at a power of about 50 W to about 200 W, and in the presence of or in an ambient of Ar, $O_2$, and/or He, as another example. In other embodiments, the protective layer 122 comprises high density TiN deposited by ALD at a temperature of about 80 degrees C. to about 300 degrees C., at a pressure of about 1 Torr to about 20 Torr, at a frequency of about 13.56 MHz, at a power of about 50 W to about 200 W, in the presence of or in an ambient of Ar, $O_2$, and/or He, and using a flow rate of about 10 to about 500 standard cubic centimeters per minute (s.c.c.m.), as yet another example. A protective layer 122 comprising TiN comprises a greater or higher density material than the TiN of the hard mask 110 in some embodiments, for example. Alternatively, other processing parameters may be used to form the protective layer 122.

Figure 7:
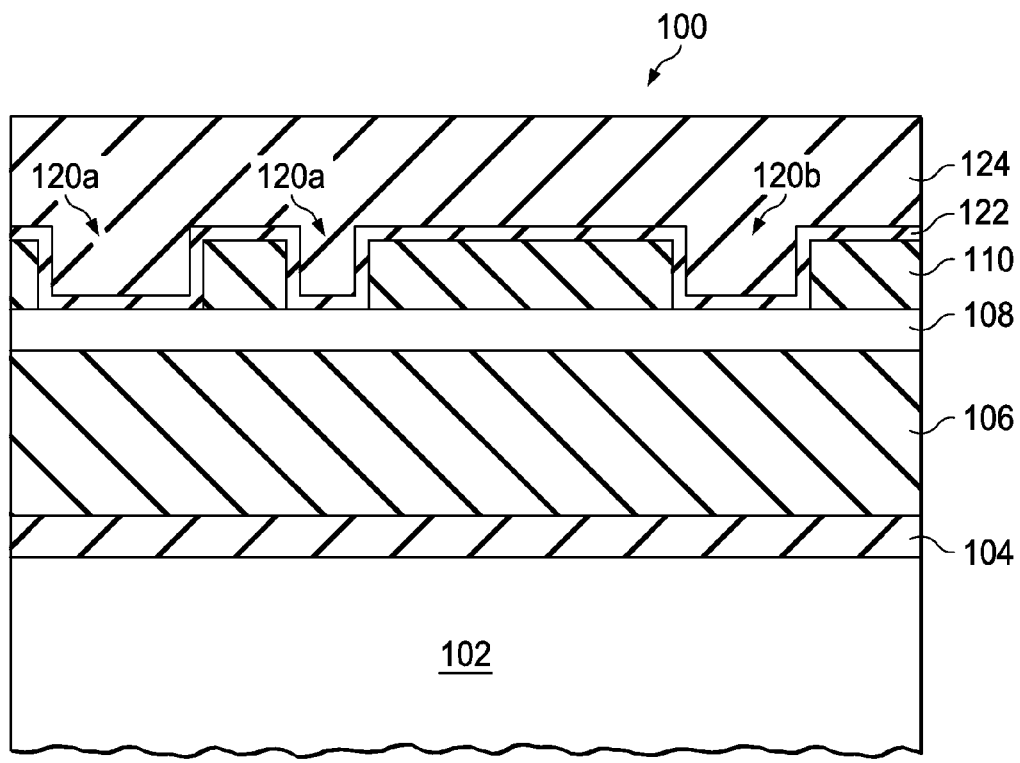

In accordance with some embodiments, after the protective layer 122 is formed, portions of the hard mask 110 and portions of the protective layer 122 are then altered using a self-aligned double patterning (SADP) method, as shown in FIGS. 9 through 15. Before the SADP method, an insulating material 124 is formed over the protective layer 122, as shown in FIG. 7. The insulating material 124 fills the first pattern 120a and the second pattern 120b in the hard mask 110, over the protective layer 122. For example, the protective layer 122 is substantially conformal in some embodiments, retaining the shape and topography of the first pattern 120a and the second pattern 120b in the hard mask 110. The insulating material 124 is applied so that it fills the patterns 120a and 120b and also covers the top surface of the protective layer 122, as shown in FIG. 7. The insulating material 124 comprises spin-on glass in some embodiments, for example. Alternatively, the insulating material 124 may comprise other materials. The insulating material 124 may comprise a thickness of about 1,500 Angstroms over the top surfaces of the protective layer 122 in some embodiments, for example. Alternatively, the insulating material 124 may comprise other dimensions.

Figure 8:
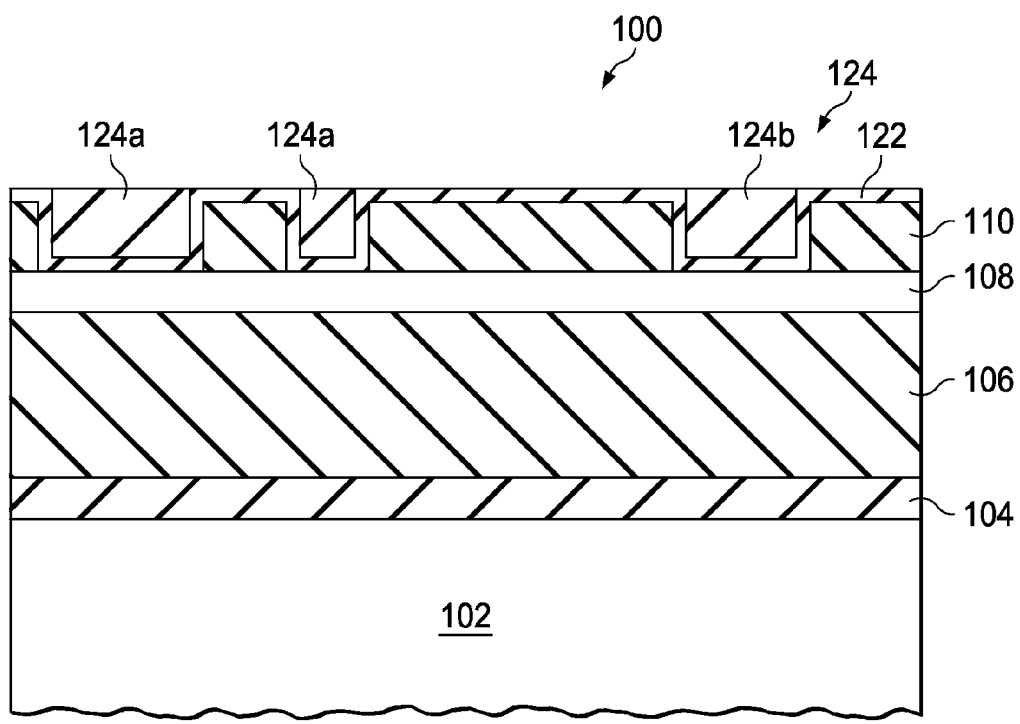

Excess portions of the insulating material 124 are removed from over the top surfaces of the protective layer 122 using a chemical-mechanical polish (CMP) process and/or etch process, as shown in FIG. 8. In some embodiments, the insulating material 124 is removed using a dry etch process, as an example. Alternatively, other methods may be used to remove the insulating material 124 from over the top surfaces of the protective layer 122. Portions of the insulating material 124a and 124b are left remaining in the first pattern 120a and the second pattern 120b, respectively, as shown in FIG. 8.

Figure 9:
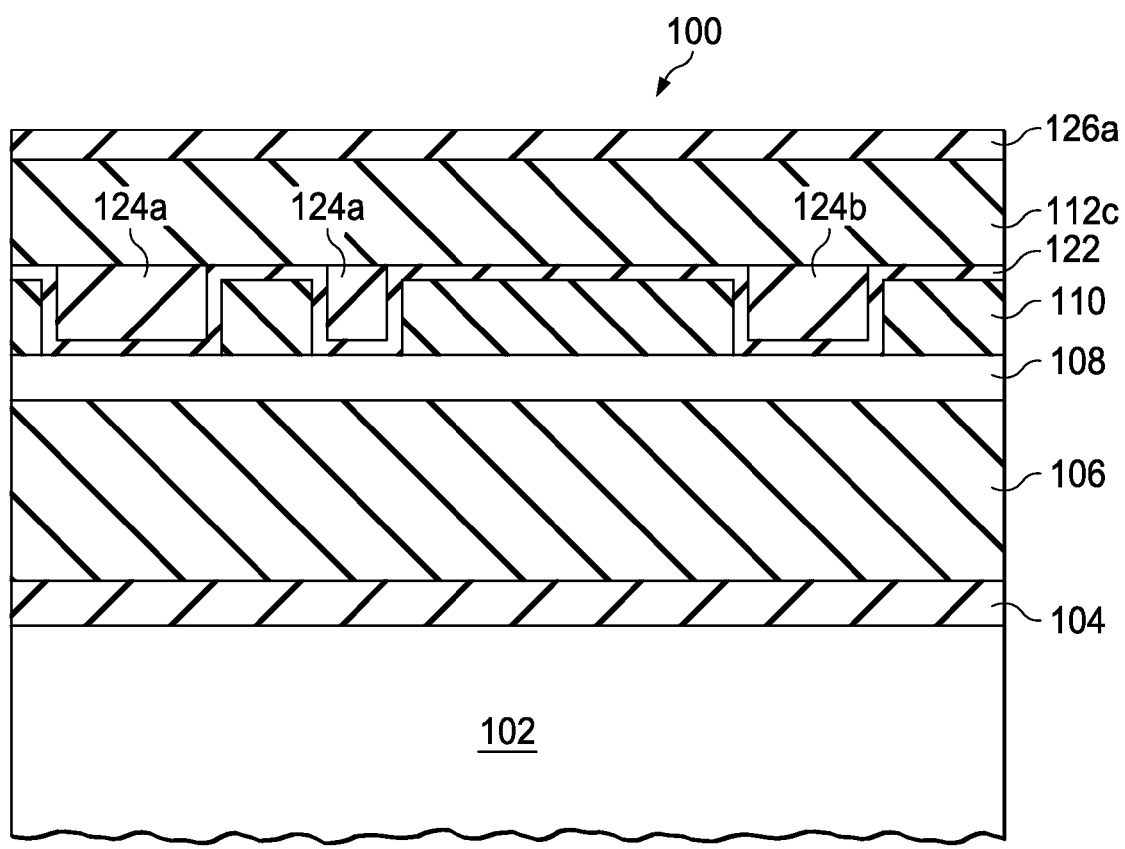

The SADP process is then performed on the semiconductor device 100, as shown in FIGS. 9 through 15. First, a bottom transfer layer 112c comprising similar materials and dimensions as bottom transfer layer 112a shown in FIG. 2 is formed over the exposed top surfaces of the protective layer 122 and the insulating material 124a and 124b, as shown in FIG. 9. The bottom transfer layer 112c is also referred to herein, e.g., in some of the claims, as a first masking material. An oxide material 126a is formed over the bottom transfer layer 112c in some embodiments. The oxide material 126a comprises a low-temperature ALD oxide in some embodiments. The oxide material 126a may comprise about 50 Angstroms to about 100 Angstroms of silicon dioxide deposited using ALD at a temperature of about 25 degrees C. to about 400 degrees C., as an example. Alternatively, the oxide material 126a may comprise other materials and dimensions, and may be formed using other methods.

Figure 10:
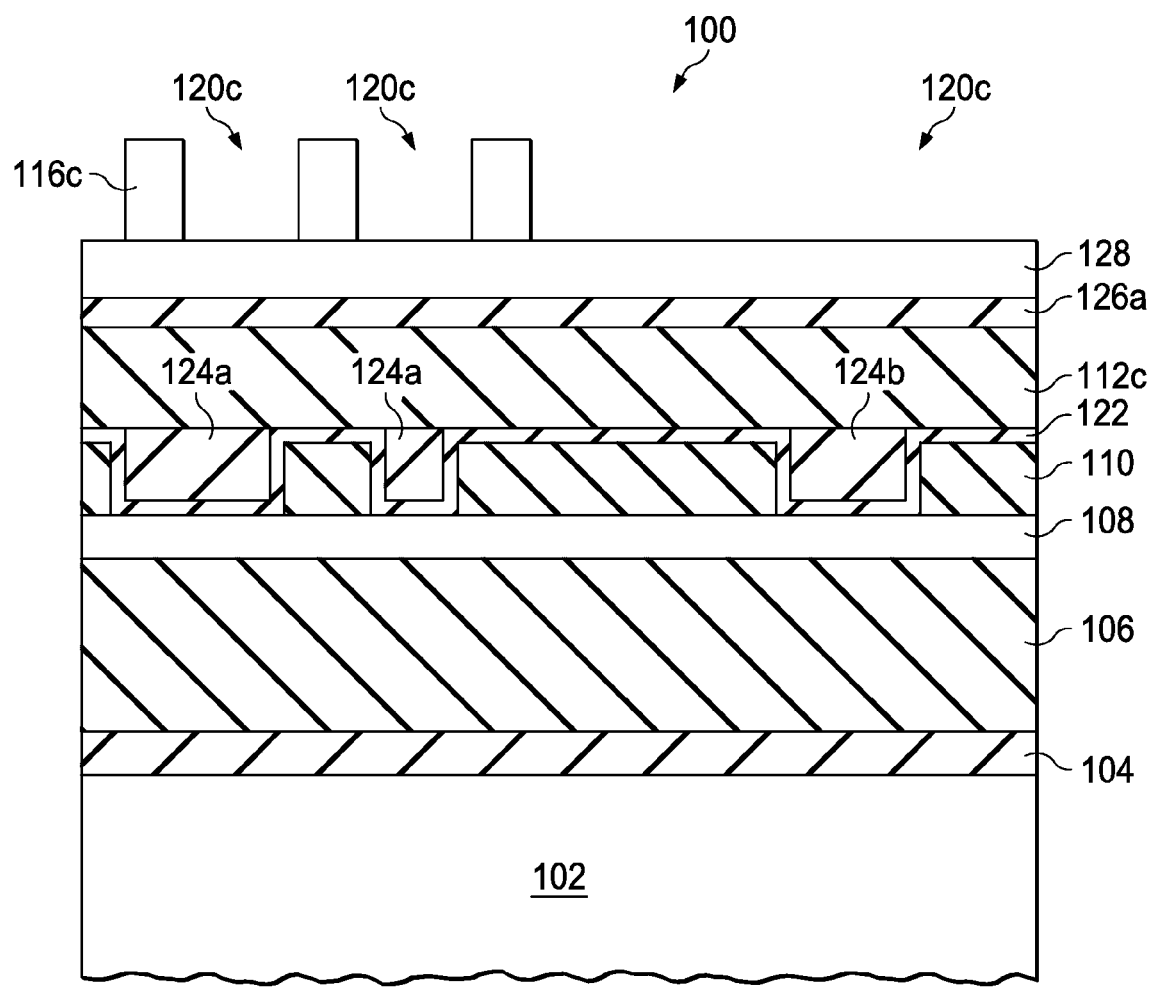

An ARC 128 is formed over the oxide material 126a, as shown in FIG. 10. The ARC 128 comprises a bottom ARC (BARC) 128 in some embodiments, for example. The BARC 128 may comprise a thickness of about 550 Angstroms, in some embodiments. Alternatively, the ARC 128 may comprise other materials and dimensions. A photoresist 116c is formed over the ARC 128, also shown in FIG. 10. The photoresist 116c is patterned using a third lithography process and a third lithography mask to form a third pattern 120c in the photoresist 116c. The third lithography process is used to pattern the bottom transfer layer 112c in some embodiments, e.g., by transferring the third pattern 120c from the photoresist 116c to the bottom transfer layer 112c.

Figure 11:
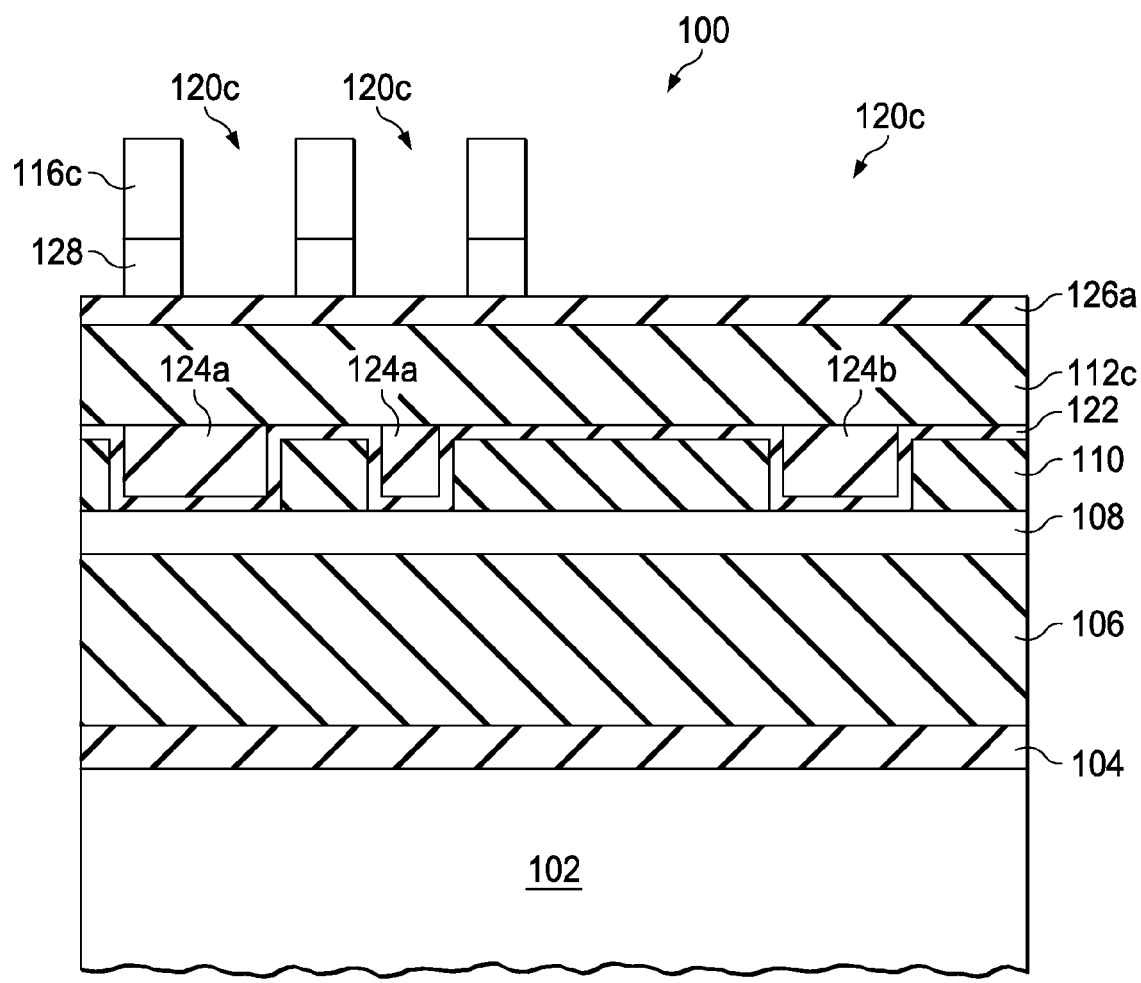
Figure 12:
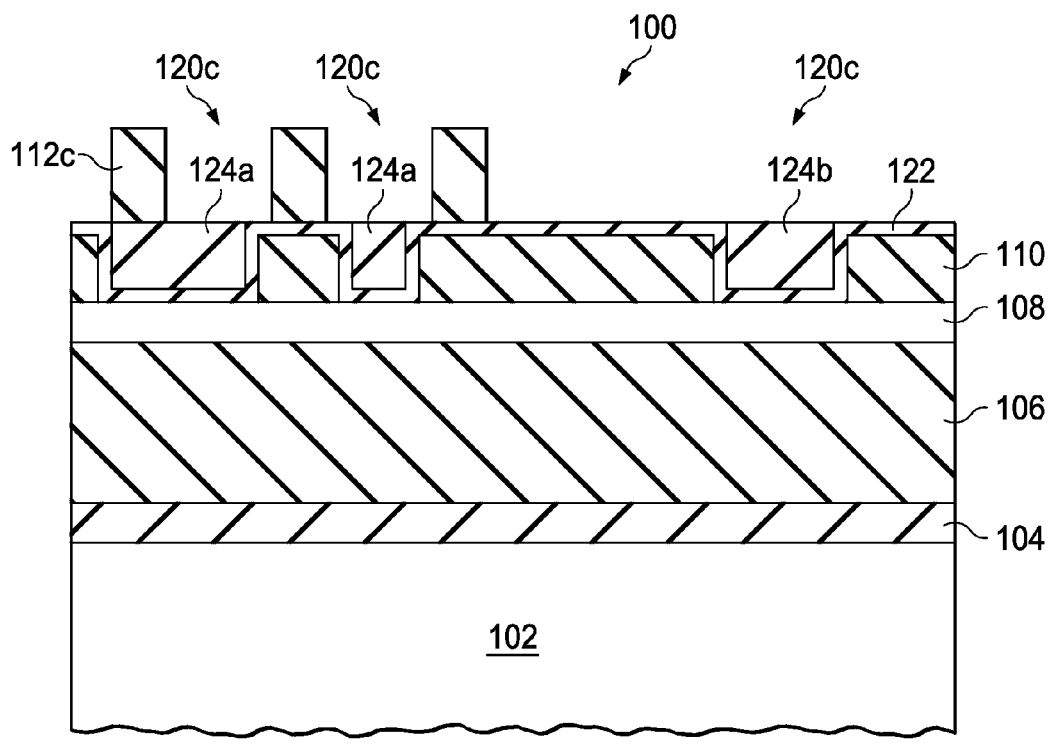

For example, to transfer the third pattern 120c from the photoresist 116c to the bottom transfer layer 112c, the third pattern 120c is transferred from the photoresist 116c to the ARC 128 using an etch process, as shown in FIG. 11. The photoresist 116c and ARC 128 are used as an etch mask during an etch process used to pattern the oxide material 126a and the bottom transfer layer 112c, as shown in FIG. 12. The remaining portions of the oxide material 126a, ARC 128, and photoresist 116c are then removed, also shown in FIG. 12. Portions of the bottom transfer layer 112c are left remaining that include the third pattern 120c. The third pattern 120c comprises the spaces between the bottom transfer layer 112c left remaining. The portions of the bottom transfer layer 112c left remaining comprise pillars that may extend in and out of the view shown and may comprise a width of about 220 Angstroms, for example. Alternatively, the pillars of the bottom transfer layer 112c may comprise other shapes and dimensions.

Figure 13:
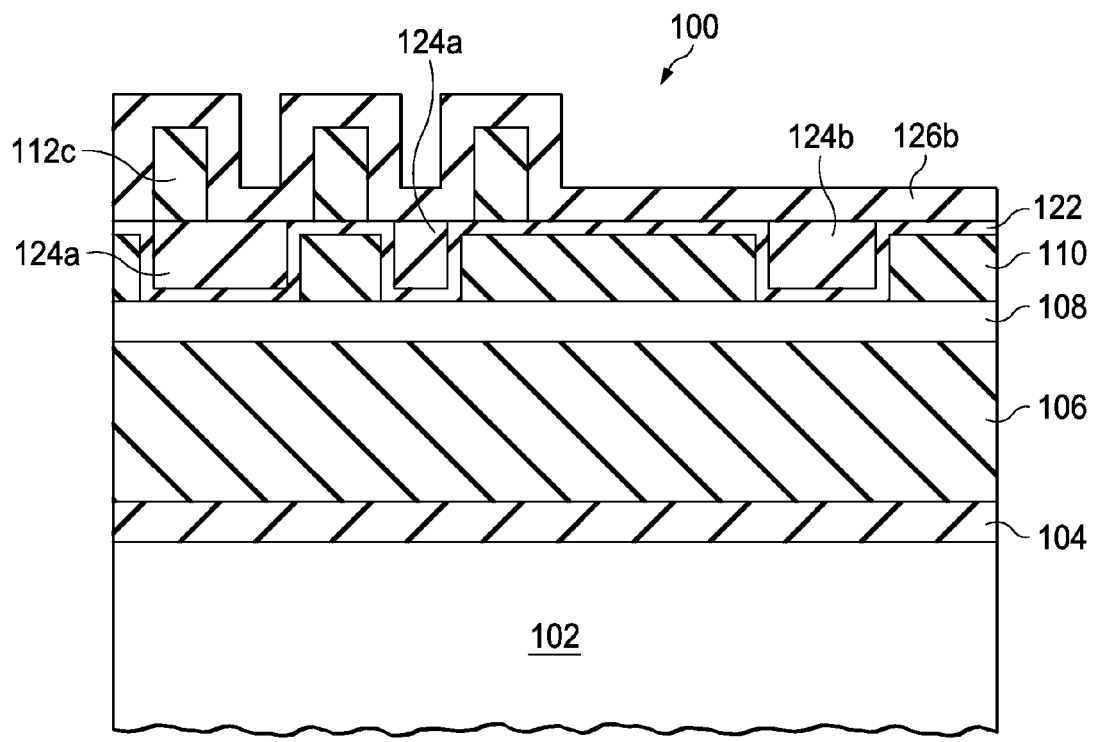

Next, an oxide material 126b is formed over the patterned bottom transfer layer 112c and over the exposed top surfaces of the protective layer 122 and the exposed top surfaces of the insulating material 124a and 124b, as shown in FIG. 13. The oxide material 126b is also referred to herein, e.g., in some of the claims, as a second masking material. The oxide material 126b comprises similar materials and deposition methods as described for oxide material 126a shown in FIG. 10. However, in some embodiments, the oxide material 126b is thicker than oxide material 126a and comprises a thickness of about 240 Angstroms, as an example. Alternatively, the oxide material 126b may comprise other dimensions. The oxide material 126b is substantially conformal in some embodiments and conforms to the topography of the pillars formed in the bottom transfer material 112c.

Figure 14:
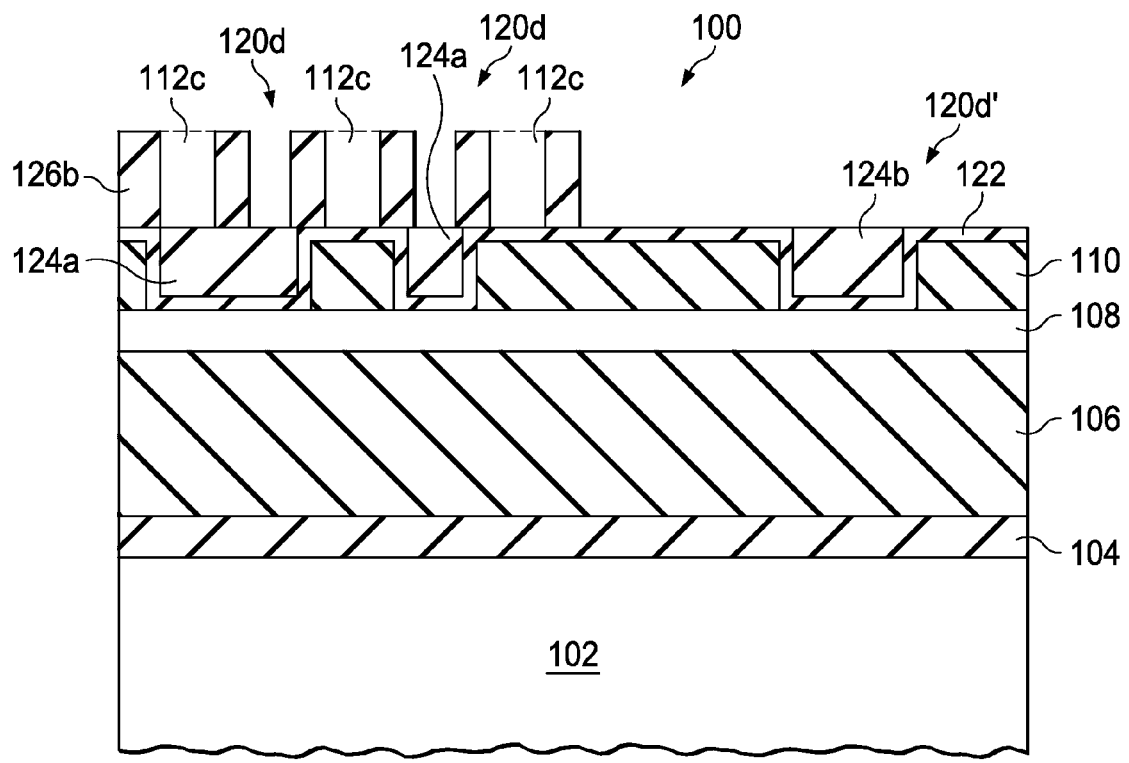

The oxide material 126b is removed from the top surfaces of the bottom transfer layer 112c, the top surfaces of the protective layer 122, and the top surfaces of the insulating material 124a and 124b, yet portions of the oxide material 126b are left remaining on the sidewalls of the bottom transfer layer 112c, as shown in phantom (e.g., in dashed lines) in FIG. 14. Portions of the oxide material 126b may be removed using an anisotropic etch process that removes more material from top surfaces of the oxide material 126b than from sidewalls of features such as the pillars of the bottom transfer layer 112c. The shape of the oxide material 126b is self-aligned to the shape of the bottom transfer layer 112c which was formed by the third lithography process.

The bottom transfer layer 112c is then removed, also shown in FIG. 14. The bottom transfer layer 112c comprises a mandrel that is used to form the desired shape of the oxide material 126b in some embodiments, for example. The oxide material 126b left remaining may comprise a plurality of pillars that extend in and out of the paper in the view shown, for example. A pillar of the oxide material 126b is left remaining on both sides of the pillars of the bottom transfer material 112c, for example. The oxide material 126b comprises a pattern 120d for a plurality of trenches on the left side in FIG. 14, and an open pattern 120d' without trenches on the right side. The patterns 120d and 120d' comprise the spaces between the oxide material 126b left remaining. The patterns 120d and 120d' comprise a fourth pattern. Portions of the fourth pattern 120d have a smaller pitch than a pitch of the third pattern 120c of the bottom transfer layer 112c in some embodiments, for example.

Figure 15:
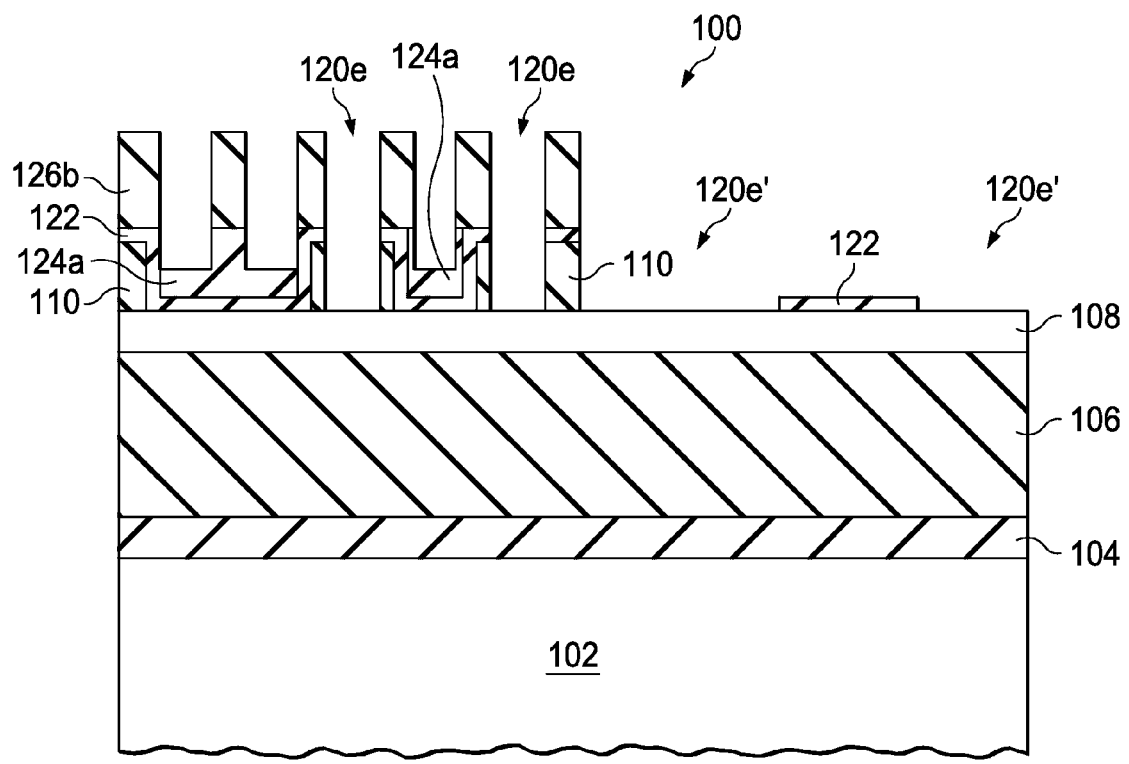

Portions of the hard mask 110 and portions of the protective layer 122 are then altered using the SADP patterning method (e.g., the method using to pattern the oxide material 126b using the bottom transfer layer 112c as a mandrel, shown in FIGS. 9 through 14). For example, portions of the hard mask 110 and portions of the protective layer 122 are then altered using the oxide material 126b as an etch mask during an etch process, as shown in FIG. 15. Portions of the insulating material 124a are also removed during the etch process. For example, the top portions of exposed insulating material 124a have been removed in FIG. 15 after the etch process. Some portions of the insulating material 124a are left remaining beneath and proximate the oxide material 126b, due to the presence of the oxide material 126b. The insulating material 124a prevents the protective layer 122 from being removed in predetermined regions. In some embodiments, the entire insulating material 124b is removed in wider regions, shown on the right side of FIG. 15. Portions of the protective layer 122 are left remaining that were previously disposed beneath insulating material 124b in some embodiments, because the protective layer 122 was covered by the insulating material 124b during the etch process. Exposed portions of the protective layer 122 and the hard mask 110 are removed in the etch process, leaving fifth patterns 120e and 120e' in the protective layer 122 and the hard mask 110 disposed over the ARC 108. Patterns 120e' are wider than patterns 120e.

Figure 16:
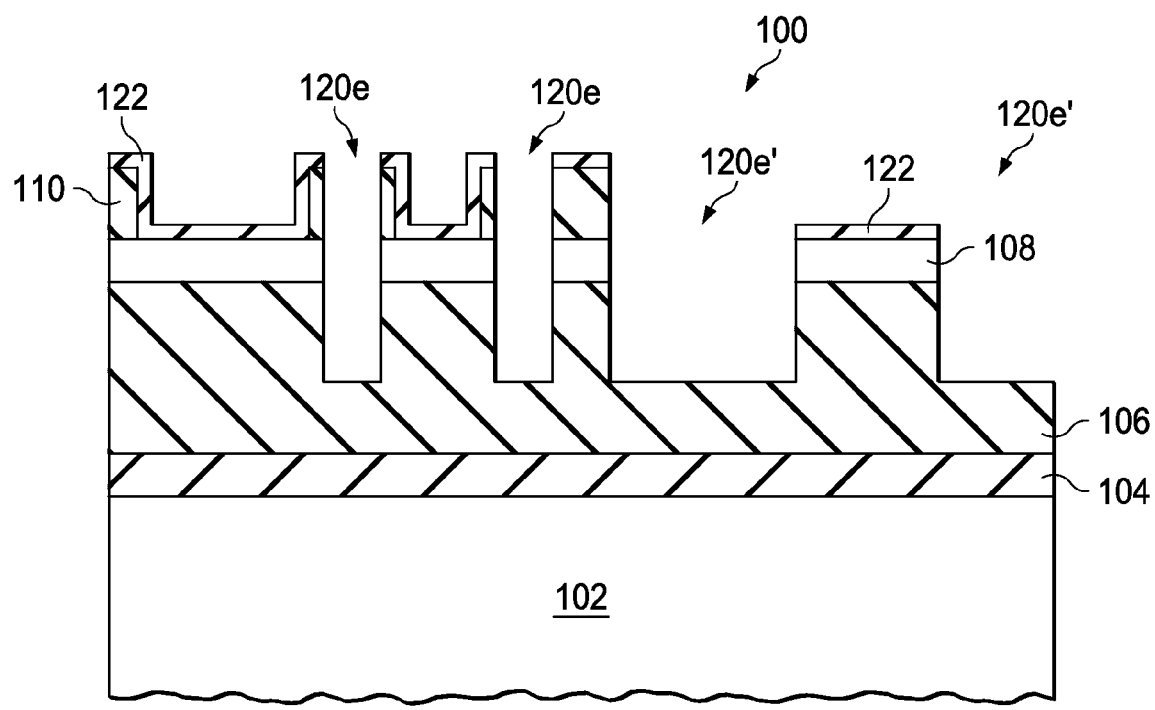
Figure 17:
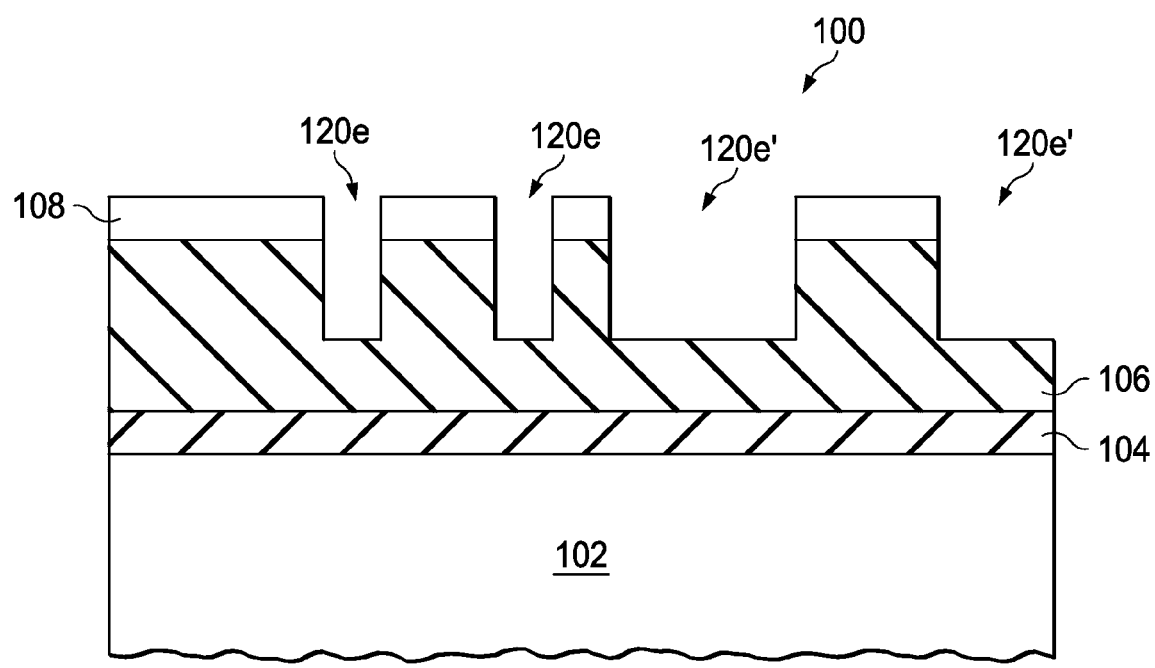

The oxide material 126b and the remaining portions of the insulating material 124a are then removed, as shown in FIG. 16. An underlying material is patterned using the hard mask 110 and the protective layer 122 as a masking material. For example, in FIG. 16, the ARC 108 and the material layer 106 are patterned using the hard mask 110 and the protective layer 122 as an etch mask during an etch process, transferring the fifth patterns 120e and 120e' to the ARC 108 and the material layer 106. The protective layer 122 and the hard mask 110 are then removed, as shown in FIG. 17.

Advantageously, including the protective layer 122 over the hard mask 110 prevents removal of the hard mask 110 material in undesired regions of the hard mask 110, such as proximate the wider patterns 120e', resulting in a desired pattern 120e' being formed in the ARC 108 and insulating material layer 106. The protective layer 122 prevents removal of undesired regions of the hard mask 110, during the altering of the portions of the hard mask 110 using the SADP method in some embodiments, for example.

Figure 18:
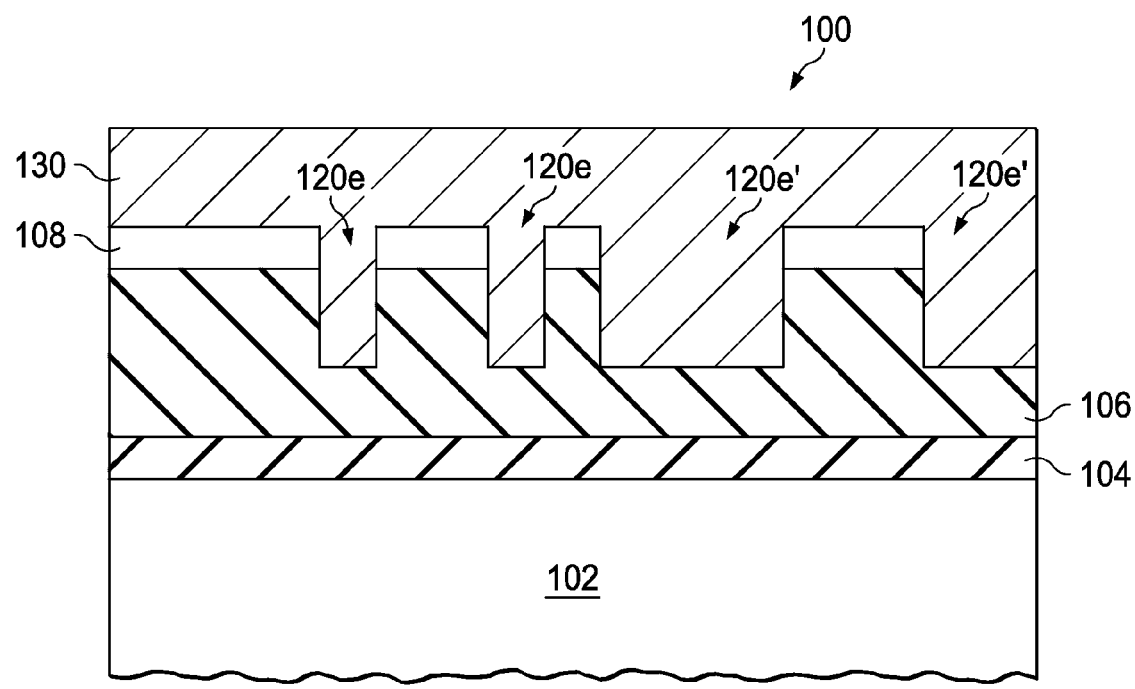

In some embodiments wherein the material layer 106 comprises an insulating material layer 106, a conductive material 130 is then formed over the patterned insulating material layer 106 and ARC 108, as shown in FIG. 18. The ARC 108 may be removed before depositing the conductive material 130, not shown. The patterned insulating material layer 106 is filled with the conductive material 130 to form a plurality of conductive features in the patterned insulating material layer 106. Filling the patterned insulating material layer 106 comprises forming a barrier layer (not shown) over the patterned insulating material layer 106, forming a seed layer (also not shown) over the barrier layer, and forming copper or a copper alloy over the seed layer in some embodiments, for example. The copper or copper alloy is plated onto the seed layer in some embodiments. An electro-chemical plating (ECP) process may be used, as an example. Alternatively, the copper or copper alloy may be formed using other methods. Alternatively, a barrier layer or seed layer may not be included, and other conductive materials may be used.

The conductive material 130 is then removed from over a top surface of the insulating material layer 106 using a CMP process, an etch process, and/or combinations thereof, as shown in FIG. 19 in a cross-sectional view. The ARC 108 may also be removed during the CMP and/or etch process, in embodiments wherein the ARC 108 was not removed before depositing the conductive material 130.

A top view of the semiconductor device 100 shown in FIG. 19 is shown in FIG. 20 in accordance with some embodiments. FIG. 19 is a cross-sectional view of the semiconductor device 100 at view 19-19' of FIG. 20, for example. FIG. 20 illustrates some examples of patterns of conductive lines LA and LB in accordance with some embodiments. The conductive lines LA and LB may alternatively comprise other shapes. The conductive lines LA comprise a plurality of conductive lines that may comprise a minimum feature size of the semiconductor device 100 in some embodiments. The conductive lines LA may alternatively be larger than the minimum feature size. The width of the conductive lines LA and LB may comprise about 20 to 25 nm in some embodiments, for example. Alternatively, the width of the conductive lines LA and LB may comprise other dimensions.

The conductive line LB on the right in FIGS. 19 and 20 comprises a capacitor plate 134 in some embodiments. The capacitor plate 134 includes an opening 132 in some embodiments. The size and shape of the opening 132 in the capacitor plate 134 advantageously comprises a desired or intended size and shape, due to the novel patterning method and protective layer 122 described herein, because the protective layer 122 prevents undesired removal of the hard mask 110 in regions such as proximate the location of the opening 132.

FIGS. 19 and 20 also illustrate regions 140 where the conductive lines LA and LB are cut. The cut conductive lines LA and LB comprise uncut portions that are formed simultaneously with the etch step shown in FIG. 16, for example. The insulating material 124a (see FIGS. 8 through 15) is formed over the protective layer 122 in the line cut regions 140 during the etch process shown in FIG. 16 results in the formation of the line cut regions 140. The protective layer 122 provides increased etch selectivity which improves the cut window and capability.

Figure 21:
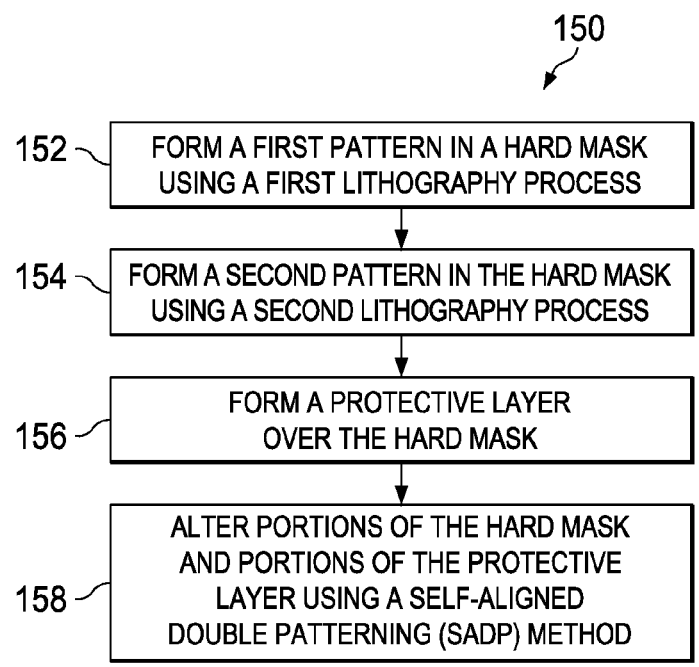
FIG. 21 is a flow chart of a method of manufacturing a semiconductor device in accordance with some embodiments.

FIG. 21 is a flow chart 150 of a method of manufacturing a semiconductor device 100 in accordance with some embodiments of the present disclosure. In step 152, a first pattern 120a is formed in a hard mask 110 using a first lithography process (see also FIGS. 1 through 3). In step 154, a second pattern 120b is formed in the hard mask 110 using a second lithography process (see FIGS. 4 and 5). In step 156, a protective layer 122 is formed over the hard mask 110. In step 158, portions of the hard mask 110 and portions of the protective layer 122 are altered using an SADP method (see FIGS. 9 through 15). Advantageously, the protective layer 122 prevents removal of portions of the hard mask 110 in undesired regions (e.g., of the hard mask 110 material).

Advantages of some embodiments of the disclosure include providing novel patterning schemes for semiconductor devices wherein a protective layer is formed after initial lithography processes, to preserve and protect the hard mask material and prevent loss of the hard mask material during subsequent etch processes. The protective layer provides protection for the hard mask and maintains the original shape of the hard mask material during etch processes. The protective layer provides increased etch selectivity during various etch processes of the semiconductor device. The protective layer increases cut window and capability, and results in improved conductive line LA and LB depth uniformity. In addition, the novel manufacturing and patterning methods and designs are easily implementable in manufacturing process flows.

In accordance with some embodiments of the present disclosure, a method of manufacturing a semiconductor device includes forming a first pattern in a hard mask using a first lithography process, and forming a second pattern in the hard mask using a second lithography process. The method includes forming a protective layer over the hard mask, and altering portions of the hard mask and portions of the protective layer using a SADP method.

In accordance with other embodiments, a method of manufacturing a semiconductor device includes providing a workpiece including an insulating material layer disposed thereon, and forming a hard mask over the insulating material layer. A first pattern is formed in the hard mask using a first lithography process, and a second pattern is formed in the hard mask using a second lithography process. A protective layer is formed over the hard mask and the insulating material layer. The first pattern and the second pattern are filled with an insulating material over the protective layer. Portions of the hard mask and portions of the protective layer are altered using a SADP method. The insulating material layer is patterned using the hard mask and the protective layer as an etch mask.

In accordance with other embodiments, a method of manufacturing a semiconductor device includes providing a workpiece including an insulating material layer disposed thereon, and forming a hard mask over the insulating material layer. A first pattern is formed in the hard mask using a first lithography process, and a second pattern is formed in the hard mask using a second lithography process. A protective layer is formed over the hard mask and the insulating material layer, and the first pattern and the second pattern are filled with an insulating material over the protective layer. A first masking material is formed over the protective layer and the insulating material, and the first masking material is patterned with a third pattern. A second masking material is formed over the patterned first masking material, the protective layer, and the insulating material. The second masking material is removed from a top surface of the first masking material, a top surface of the protective layer, and a top surface of the insulating material yet the second masking material is left remaining on sidewalls of the first masking material. The method includes removing the first masking material, and removing portions of the protective layer, portions of the insulating material, and portions of the hard mask using the second masking material as an etch mask. The second masking material and the insulating material are removed. The insulating material layer is patterned using the protective layer and the hard mask as an etch mask. The patterned insulating material layer is filled with a conductive material to form a plurality of conductive features.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:

forming a first pattern in a hard mask using a first lithography process;

forming a second pattern in the hard mask using a second lithography process;
forming a protective layer over the hard mask; and
forming a first masking layer over the protective layer;
patterning the first masking layer into a mandrel;
conformally forming a second masking layer on the mandrel;
removing horizontal portions of the second masking layer, wherein vertical portions remain on sidewalls of the mandrel; and
etching portions of the hard mask and portions of the protective layer using the vertical portions as an etch mask.

2. The method according to claim 1, further comprising patterning an underlying material using the hard mask and the protective layer as a masking material.

3. The method according to claim 1, wherein the forming the protective layer comprises forming a material selected from the group consisting essentially of AlON, TiO, TiN, and combinations thereof.

4. The method according to claim 1, wherein the forming the protective layer comprises forming a material layer comprising a thickness of about 5 Angstroms to about 20 Angstroms.

5. The method according to claim 1, wherein the forming the protective layer comprises an atomic layer deposition (ALD) process.

6. The method according to claim 1, wherein the hard mask comprises a material selected from the group consisting essentially of TiN, TiO, amorphous Si, SiN, and combinations thereof.

7. The method according to claim 1, wherein the hard mask comprises a thickness of about 500 Angstroms or less.

8. A method of manufacturing a semiconductor device, the method comprising:
providing a workpiece including an insulating material layer disposed thereon;
forming a hard mask over the insulating material layer;
forming a first pattern in the hard mask using a first lithography process;
forming a second pattern in the hard mask using a second lithography process;
forming a protective layer over the hard mask and the insulating material layer;
filling the first pattern and the second pattern with an insulating material over the protective layer;
forming a first masking material over the insulating material and the protective layer;
patterning the first masking material into pillars;
conformally forming a second masking material over the pillars and exposed portions of the protective layer and the insulating material;
removing portions of the second masking material from a top surface of the pillars, a top surface of the protective layer, and a top surface of the insulating material, wherein the second masking material remains on sidewalls of the pillars;
etching portions of the hard mask and portions of the protective layer using the remaining second masking material; and
patterning the insulating material layer using the hard mask and the protective layer as an etch mask.

9. The method according to claim 8, further comprising filling the patterned insulating material layer with a conductive material to form a plurality of conductive features in the patterned insulating material layer.

10. The method according to claim 9, wherein the filling the patterned insulating material layer comprises forming a barrier layer over the patterned insulating material layer, forming a seed layer over the barrier layer, and forming copper or a copper alloy over the seed layer.

11. The method according to claim 9, further comprising removing the conductive material from over a top surface of the insulating material layer using a process selected from the group consisting essentially of a chemical-mechanical polishing (CMP) process, an etch process, and combinations thereof.

12. The method according to claim 8, wherein the forming the hard mask comprises a physical vapor deposition (PVD) process, an atomic layer deposition (ALD) process, or a chemical vapor deposition (CVD) process.

13. The method according to claim 8, further comprising forming an antireflective coating (ARC) over the insulating material layer, before forming the hard mask.

14. The method according to claim 8, wherein the protective layer prevents removal of undesired regions of the hard mask, during the etching of the portions of the hard mask using the remaining second masking material.

15. A method of manufacturing a semiconductor device, comprising:
providing a workpiece including an insulating material layer disposed thereon;
forming a hard mask over the insulating material layer;
forming a first pattern in the hard mask using a first lithography process;
forming a second pattern in the hard mask using a second lithography process;
forming a protective layer over the hard mask and the insulating material layer;
filling the first pattern and the second pattern with an insulating material over the protective layer;
forming a first masking material over the protective layer and the insulating material;
patterning the first masking material with a third pattern;
forming a second masking material over the patterned first masking material, the protective layer and the insulating material;
removing the second masking material from a top surface of the first masking material, a top surface of the protective layer, and a top surface of the insulating material yet leaving the second masking material on sidewalls of the first masking material;
removing the first masking material;
removing portions of the protective layer, portions of the insulating material, and portions of the hard mask using the second masking material as an etch mask;
removing the second masking material and the insulating material;
patterning the insulating material layer using the protective layer and the hard mask as an etch mask; and
filling the patterned insulating material layer with a conductive material to form a plurality of conductive features.

16. The method according to claim 15, wherein after removing the second masking material from the top surface of the first masking material, the top surface of the protective layer, and the top surface of the insulating material yet leaving the second masking material on the sidewalls of the first masking material, the second masking material comprises a fourth pattern; and wherein portions of the fourth pattern have a smaller pitch than the third pattern of the first masking material.

17. The method according to claim 15, wherein the plurality of conductive features comprises a plurality of conductive lines.

18. The method according to claim 15, wherein one of the plurality of conductive features comprises a capacitor plate.

19. The method according to claim 18, wherein the capacitor plate includes an opening.

20. The method according to claim 15, wherein the patterning the first masking material with the third pattern comprises a third lithography process.

* * * * *